(12) United States Patent
Miyashita

(10) Patent No.: US 9,685,307 B2
(45) Date of Patent: Jun. 20, 2017

(54) SPUTTERING TARGET, SPUTTERING TARGET-BACKING PLATE ASSEMBLY AND DEPOSITION SYSTEM

(75) Inventor: Hirohito Miyashita, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 1304 days.

(21) Appl. No.: 11/719,013

(22) PCT Filed: Oct. 14, 2005

(86) PCT No.: PCT/JP2005/018922
§ 371 (c)(1),
(2), (4) Date: May 10, 2007

(87) PCT Pub. No.: WO2006/054409
PCT Pub. Date: May 26, 2006

(65) Prior Publication Data
US 2008/0116066 A1    May 22, 2008

(30) Foreign Application Priority Data
Nov. 17, 2004 (JP) .................. 2004-332532

(51) Int. Cl.
*H01J 37/34* (2006.01)
*C23C 14/34* (2006.01)

(52) U.S. Cl.
CPC ...... *H01J 37/3423* (2013.01); *C23C 14/3407* (2013.01); *H01J 37/3435* (2013.01)

(58) Field of Classification Search
CPC .............. C23C 14/3407; H01J 37/3435; H01J 37/3423; H01J 37/3414; H01J 37/3417
(Continued)

(56) References Cited

U.S. PATENT DOCUMENTS 5,039,913 A  8/1991  Wegmann et al.
5,066,381 A  11/1991 Ohta et al.
(Continued)

FOREIGN PATENT DOCUMENTS

EP     1087033 A1 *  3/2001
JP     S62-037369 A  2/1987
(Continued)

OTHER PUBLICATIONS

Machine Translation of JP06140330.*
(Continued)

*Primary Examiner* — Michael Band
(74) *Attorney, Agent, or Firm* — Howson & Howson, LLP

(57) ABSTRACT

Provided is a tabular sputtering target on which an erosion portion and a non-erosion portion are formed, and the surface area thereof exceeds 100% but is less than 125% of the surface area when the target is assumed to be planar. Also provided is a tabular sputtering target on which an erosion portion and a non-erosion portion are formed comprising one or more concave portions on the target surface region, and the surface area thereof exceeds 100% but is less than 125% of the surface area when the target is assumed to be planar. An inexpensive, small-capacity power supply unit can be used by minimizing the electrical variations in the sputtering circuit as much as possible throughout the lifespan of the target through self sputtering or high power sputtering.

3 Claims, 1 Drawing Sheet

(58) Field of Classification Search
USPC .................................. 204/298.12, 298.13
See application file for complete search history.

(56) References Cited

U.S. PATENT DOCUMENTS

| | | | | |
|---|---|---|---|---|
| 5,336,386 | A * | 8/1994 | Marx et al. | 204/298.12 |
| 5,632,869 | A | 5/1997 | Hurwitt et al. | |
| 5,693,203 | A | 12/1997 | Ohhashi et al. | |
| 6,086,735 | A * | 7/2000 | Gilman et al. | 204/298.12 |
| 6,340,415 | B1 * | 1/2002 | Raaijmakers et al. | 204/192.12 |
| 6,497,797 | B1 * | 12/2002 | Kim | 204/192.13 |
| 6,599,405 | B2 * | 7/2003 | Hunt et al. | 204/298.12 |
| 6,638,402 | B2 * | 10/2003 | Marx et al. | 204/298.12 |
| 6,702,930 | B1 * | 3/2004 | Cheng et al. | 204/192.2 |
| 6,759,143 | B2 | 7/2004 | Oda et al. | |
| 6,793,124 | B1 | 9/2004 | Takahashi et al. | |
| 6,811,657 | B2 * | 11/2004 | Jaso | 204/192.13 |
| 6,858,116 | B2 | 2/2005 | Okabe et al. | |
| 6,875,325 | B2 | 4/2005 | Miyashita et al. | |
| 6,916,407 | B2 * | 7/2005 | Voser et al. | 204/192.12 |
| 7,347,353 | B2 | 3/2008 | Yamakoshi et al. | |
| 7,618,520 | B2 * | 11/2009 | Wu et al. | 204/298.12 |
| 2003/0178301 | A1 * | 9/2003 | Lynn et al. | 204/298.12 |
| 2004/0009087 | A1 * | 1/2004 | Yi et al. | 419/8 |
| 2004/0265616 | A1 | 12/2004 | Yamakoshi et al. | |
| 2007/0051624 | A1 | 3/2007 | Okabe et al. | |
| 2007/0107185 | A1 * | 5/2007 | Bailey et al. | 29/428 |
| 2009/0008245 | A1 | 1/2009 | Yamakoshi et al. | |
| 2009/0229975 | A1 | 9/2009 | Yamakoshi | |
| 2009/0277788 | A1 | 11/2009 | Oda et al. | |

FOREIGN PATENT DOCUMENTS

| | | | |
|---|---|---|---|
| JP | 06-140330 A | | 5/1994 |
| JP | 11-193457 A | | 7/1999 |
| JP | 11343567 A | * | 12/1999 |
| JP | 2001-011617 A | | 1/2001 |
| JP | 2001011617 A | * | 1/2001 |
| JP | 2003-027225 A | | 1/2003 |
| JP | 2003027225 A | * | 1/2003 |
| JP | 2003-226965 A | | 8/2003 |
| JP | 2003226965 A | * | 8/2003 |
| JP | 2004-084007 A | | 3/2004 |
| WO | WO 0242518 A1 | * | 5/2002 |

OTHER PUBLICATIONS

Machine Translation JP11343567.*
ESP@CENET Database, English Abstract of JP 6-140330, May 20, 1994.
ESP@CENET Database, English Abstract of JP 62-037369, Feb. 18, 1987.

* cited by examiner

# SPUTTERING TARGET, SPUTTERING TARGET-BACKING PLATE ASSEMBLY AND DEPOSITION SYSTEM

BACKGROUND OF THE INVENTION

The present invention relates to a sputtering target, a sputtering target-backing plate assembly and a deposition system capable of providing an inexpensive sputtering device by allowing for the power supply design of a sputtering device as a result of inhibiting changes in the voltage or current caused by the consumption of target during sputtering.

In recent years, self sputtering or high power sputtering for forming a uniform film on a via hole or a contact hole with a large aspect ratio pursuant to the miniaturization of wiring rules is becoming mainstream. Normally, since the circuit impedance will change pursuant to the target consumption in sputtering, maintenance of a uniform film thickness distribution and deposition rate throughout the entire lifespan of the target is sought by controlling the electrical energy to be constant.

Nevertheless, with the self sputtering and high power sputtering performed today, since changes in the current and voltage throughout the lifespan of the target are significant and a power source with an extremely large capacity is required, there is a problem in that the deposition system would become extremely costly.

Conventionally, for instance, Patent Document 1 and Patent Document 2 describe methods of processing the surface shape of the target in order to improve the film thickness distribution or reduce particles.

Nevertheless, very few reports refer to the fact that changes in the current and voltage of the sputtering device can be controlled with the surface area of the target. In addition, the current status is that there is no report that refers to the influence on the quantitative surface area.

[Patent Document 1] Japanese Patent Laid-Open Publication No. S62-37369

[Patent Document 2] Japanese Patent Laid-Open Publication No. 2004-84007

SUMMARY OF THE INVENTION

Thus, an object of the present invention is to provide a sputtering target, a sputtering target-backing plate assembly, and a deposition system employing such a sputtering target and sputtering target-backing plate assembly enabling the use of an inexpensive, small-capacity power supply unit by inhibiting the electrical fluctuation in a sputtering circuit throughout the entire lifespan of the target by self sputtering or high power sputtering.

In order to achieve the foregoing object, after intense study regarding the influence of change in shape of a planar target on the change of electrical circuit characteristics, the present inventors discovered that it is possible to minimize the impedance change of a cathode circuit by adequately enlarging the surface area of a target. Meanwhile, it has also been discovered that the enlargement of the surface area will cause the uniformity of the sputtered film to change, and the uniformity will become inferior if the surface area is excessively enlarged.

Further, under deposition conditions where the sputtering power is relatively high, heat stress will be concentrated on the concave portions and cause the target to deform, in addition to causing abnormal uniformity and generation of shields and arcing. Nevertheless, it has been discovered that these drawbacks can be overcome by thickening the backing plate (BP) thickness of the concave portions.

Based on the above, the present invention provides:
1) A planar sputtering target on which an erosion portion and a non-erosion portion are formed, and the surface area thereof exceeds 100% but is less than 125% of the surface area when the target is assumed to be planar;
2) A planar sputtering target on which an erosion portion and a non-erosion portion are formed comprising one or more concave portions on the target surface region, and the surface area thereof exceeds 100% but is less than 125% of the surface area when the target is assumed to be flat;
3) The sputtering target according to paragraph 2) above, wherein the concave portions formed on the target surface region are one or more annular concave portions;
4) The sputtering target according to paragraph 2) or paragraph 3) above, wherein the concave portions are formed on a target surface region where erosion is relatively moderate;
5) The sputtering target according to any one of paragraphs 2) to 4) above, wherein the shape of the concave portions is a groove having a V-shaped, circular or rectangular cross section;
6) An assembly of a planar sputtering target on which an erosion portion and a non-erosion portion are formed and a backing plate, wherein the sputtering target-backing plate assembly comprises one or more concave portions on a target surface region, the surface area thereof exceeds 100% but is less than 125% of the surface area when the target is assumed to be flat, and the plate thickness of the backing plate at a position corresponding to the concave portions of the target surface is thicker than the other portions;
7) The sputtering target-backing plate assembly according to paragraph 6) above, wherein the concave portions formed on the target surface region are one or more annular concave portions.
8) The sputtering target-backing plate assembly according to paragraph 6) or paragraph 7) above, wherein the concave portions are formed on a target surface region where erosion is relatively moderate;
9) The sputtering target-backing plate assembly according to any one of paragraphs 6) to 8) above, wherein the shape of the concave portions is a groove having a V-shaped, circular or rectangular cross section;
10) A deposition system employing the sputtering target according to any one of paragraphs 1) to 5) above; and
11) A deposition system employing the sputtering target-backing plate assembly according to any one of paragraphs 6) to 9) above.

The present invention yields a superior effect of being able to minimize the impedance change of a cathode circuit by adequately enlarging the surface area of a target.

Meanwhile, since the enlargement of the surface area will cause the uniformity of the sputtered film to change, and the uniformity will become inferior if the surface area is excessively enlarged, an appropriate surface area is required. The present invention is able to optimally adjust such surface area.

Further, under deposition conditions where the sputtering power is relatively high, heat stress will be concentrated on the concave portions and cause the target to deform, in addition to causing abnormal uniformity and generation of shields and arcing. Nevertheless, these drawbacks can be overcome by thickening the plate thickness of the backing plate (BP) of the corresponding concave portions of the target.

BRIEF DESCRIPTION OF THE DRAWINGS

1A is a cross section diagram of a target having a V-shaped groove.

DETAILED DESCRIPTION OF THE INVENTION

Generally speaking, the basic method of sputtering includes the steps of introducing Ar gas into the sputtering device, applying voltage between the target and substrate (wafer), colliding ionized Ar ions with the target, and arranging the target material ejected by the collision to face the target.

A self sputtering method is known as the latest sputtering method. This self sputtering method utilizes the phenomenon where the sputtered particles are ionized, and the ionized particles are used to sputter the target once again. In other words, with the self sputtering method, atoms sputtered from the target are ionized in addition to the Ar ions, and these ions are used to perform sputtering.

As a result of employing this self sputtering method, effects are yielded in that it is possible to improve the plasma density, improve the sputtering rate, and improve the linearity of the sputtered particles.

In sputtering devices of recent years, normally, when sputtering is performed to the target while maintaining a constant power of several ten kwh, the voltage and current will change in accordance with such sputtering.

With respect to voltage, it is necessary to provide a power source capable of supporting a voltage change of several hundred V in certain cases from 500V or higher throughout the target life, and the cost for the power supply unit in the device cannot be neglected.

Figure 1A:
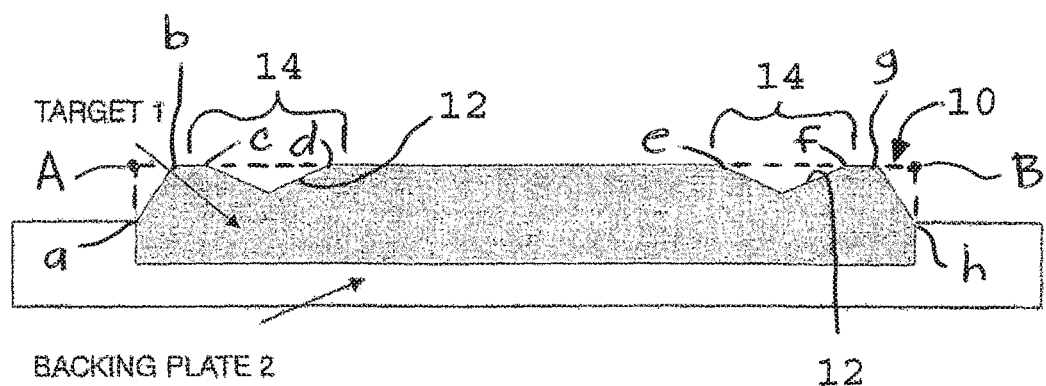
FIGS. 1 A and B are cross sections explaining the shape of the grooved target of the present invention; wherein FIG.
FIG. 1B is a cross section diagram of the assembly of this target and a backing plate with a varied thickness.

Although a target to be used in sputtering is normally a planar target with a flat surface 10 such as represented by straight line A-B in FIG. 1A that is comprised of both dashed lines and solid lines as shown in FIG. 1A, it is considered that a voltage change occurs because irregularities will arise on the target surface as the target is consumed.

As a result of intense study regarding the causal association between the changing behavior of voltage pursuant to the target consumption and the shape of irregularities formed based on such target consumption, it has been discovered that the change in the target surface area is related to the change of voltage. To express this qualitatively, it has been discovered that smaller the change of surface area, smaller the change of voltage.

Nevertheless, there are various characteristics of irregularities formed on the target by the magnet, and, since the shape changes throughout the lifespan of the target, it is difficult to comprehend the qualitative relationship. Thus, upon preparing a target having a surface shape assuming a certain degree of sputtered irregularities and examining the relationship not with the absolute value of the voltage, but by focusing on the amount of voltage change, it has been discovered that a target having a shape where the surface area thereof is less than 125% with a planar target as the reference shows a small voltage change. Simultaneously, it has also been discovered that the more the target surface area is enlarged, the change of uniformity throughout the lifespan of the target will increase.

In other words, a sputtering target 1 having an erosion portion and a non-erosion portion is shown in FIG. 1A. The sputtering face is represented in FIG. 1A by the continuous solid line starting from point "a" and extending through points "b", "c", "d", "e", "1" and "g" and ending at point "h". Thus, the sputtering face of the sputtering target 1 includes flat surfaces "b-c", "d-e", and "f-g" that fall on straight line A-B and irregularities 12 formed by surfaces "a-b", "c-d", "e-f", and "$_g$-h" which do not fall on straight line A-B in FIG. 1A. It has been discovered that the sputtering target 1 produces a smaller voltage change during a sputtering operation than a sputtering target having a sputtering face as represented by the straight line A-B in FIG. 1A, and makes it possible to keep uniformity change in sputtered film thickness within a tolerable level.

The surface area can be increased by forming irregularities 12 on the target surface as shown with solid lines extending underneath dashed lines in FIG. 1A. In addition, this effect is not limited to a specific target material and, as shown in the Examples described later, is common to all target materials regardless of the type of material.

Although the shape of irregularities 12 or where to form such irregularities 12 on the target 1 will hardly affect the voltage change, it has also been discovered that the change of uniformity is small when irregularities 12 are formed at a portion 14 where the erosion is relatively moderate.

Moreover, from the perspective of costs in forming grooves via machining, it is desirable that the shape of irregularities is one or more annular grooves having a V-shaped, circular or rectangular cross section. Nevertheless, it goes without saying that the present invention also covers grooves other than V-shaped grooves and annular irregularities.

Further, when performing a relatively high level of power sputtering such as ionized sputtering that has become mainstream in recent years, heat stress caused by the heat during sputtering will be concentrated on the irregularities; particularly the concave portions, and cause the target to deform, in addition to causing abnormal uniformity and generation of arcing on shields, and the generation of plasma will stop in extreme cases.

In order to overcome these problems, although measures were taken to increase the strength of the backing plate and reduce the heat stress by changing the material, these measures were not very effective.

Thus, giving priority to reduction of the stress concentration caused by the shape, through a trial and error process to resolve these problems by changing the shape of the backing plate, it has been discovered that it is possible to considerably inhibit deformation by simply thickening the backing plate thickness at the portion where stress is concentrated.

The portion to be thickened is not limited to only the concave portions, and it has become known that it would be more effective by thickening a slightly broader area including the concave portions. This is considered to be because the change in stress distribution became gradual.

Nevertheless, since there are various erosion shapes depending on the magnet as described above, to thicken the BP in an area that is too broad including the concave portions means that the target thickness will decrease, and this is not preferable since in certain cases the lifespan of the target will be shortened.

EXAMPLES

Examples and Comparative Examples of the present invention are now explained. Incidentally, these examples are merely illustrative, and the present invention shall in no way be limited thereby. In other words, the present invention shall include the various modes and modifications covered by the technical spirit of this invention.

Examples [1] 4 to 7, 11 to 14 and 18 to 21

Figure 1B:
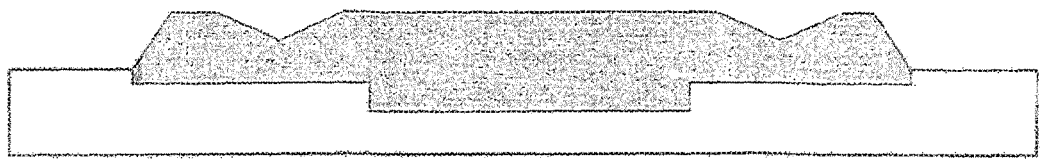

FIG. 1. A shows the cross section shape of the target of the Examples. In these Examples, a commercially available 6N purity copper target, a 4N5 Ta target and a 5N Ti target were used in an 8 inch wafer Endura™ sputtering device.

Two types of magnets were used and, with the same sputtering conditions, only the target surface area was changed to foremost examine the voltage change and uniformity change throughout the lifespan of the target.

Although the lifespan of the target will differ depending on the target material, at the same target materials, the lifespan were adjusted to be within ±10%. The sputtering power was 10 kw, and the backing plate was a Cu alloy.

The target surface area and the voltage change throughout the lifespan of the target are collectively shown in Table 1. The uniformity is the average value throughout the lifespan of the target.

In Examples [1] 4 to 7, 11 to 14 and 18 to 21, both the voltage change and uniformity change were small and showed favorable values. Since the sputtering power was low at 10 kw, warpage of the target did not become a particular problem.

TABLE 1

| | Target | Surface Area (%) | Voltage Change (V) | Uniformity (%) |
|---|---|---|---|---|
| Example 4 | 6NCu | 105 | 180 | 3.4 |
| Example 5 | 6NCu | 110 | 170 | 3 |
| Example 6 | 6NCu | 120 | 185 | 2.5 |
| Example 7 | 6NCu | 123 | 175 | 3.7 |
| Comparative Example 1 | 6NCu | 100 | 265 | 3 |
| Comparative Example 2 | 6NCu | 130 | 190 | 4.5 |
| Comparative Example 3 | 6NCu | 140 | 170 | 5.1 |
| Example 11 | 4N5Ta | 105 | 125 | 4.1 |
| Example 12 | 4N5Ta | 110 | 130 | 3.8 |
| Example 13 | 4N5Ta | 120 | 140 | 3.5 |
| Example 14 | 4N5Ta | 123 | 125 | 3.9 |
| Comparative Example 4 | 4N5Ta | 100 | 200 | 3.6 |
| Comparative Example 5 | 4N5Ta | 130 | 115 | 5 |
| Comparative Example 6 | 4N5Ta | 140 | 120 | 5.5 |
| Example 18 | 5NTi | 105 | 110 | 3.6 |
| Example 19 | 5NTi | 110 | 110 | 3.1 |
| Example 20 | 5NTi | 120 | 120 | 2.8 |
| Example 21 | 5NTi | 123 | 115 | 3.5 |
| Comparative Example 7 | 5NTi | 100 | 190 | 2.9 |
| Comparative Example 8 | 5NTi | 130 | 115 | 5.2 |
| Comparative Example 9 | 5NTi | 140 | 115 | 5.9 |

Comparative Examples 1 to 9

With these Comparative Examples, the target material and sputtering conditions were the same as the conditions of Examples [1] 4 to 7, 11 to 14 and 18 to 21, and only the surface area was changed.

The target surface area and the voltage change throughout the target lifespan are also collectively shown in Table 1. The uniformity is the average value throughout the lifespan of the target.

With Comparative Examples 1 to 9, both the voltage change and uniformity increased and were inferior. Since the sputtering power was low at 10 kw, warpage of the target did not become a particular problem.

Examples [22] 25 to 27, 31 to 33 and 37 to 39

Subsequently, the sputtering power was increased and a target having a shape shown in FIG. 1. B was used to perform a similar experiment as above, and, in addition to the voltage change, the uniformity and target warpage were examined. The sputtering power was 40 kw. Further, the backing plate was a copper alloy. The results are shown in Table 2.

With Examples [22] 25 to 27, 31 to 33 and 37 to 39, both the voltage change and uniformity change were small and showed favorable values. Further, the sputtering power was high at 40 kw and there was a possibility of causing warpage of the target, but as shown in Table 2, the warpage was small due to shape effect of the backing plate shown in FIG. 1. B, and no particular problem was caused by this warpage.

TABLE 2

| | Target | Surface Area (%) | Voltage Change (V) | Uniformity (%) | Warpage (mm) |
|---|---|---|---|---|---|
| Example 25 | 6NCu | 105 | 175 | 2.8 | 0.4 |
| Example 26 | 6NCu | 120 | 170 | 2.1 | 0.5 |
| Example 27 | 6NCu | 124 | 180 | 4.1 | 0.6 |
| Comparative Example 10 | 6NCu | 105 | 180 | 5.6 | 2.1 |
| Comparative Example 11 | 6NCu | 120 | 170 | 6.2 | 3.3 |
| Example 31 | 4N5Ta | 105 | 125 | 3.9 | 0.2 |
| Example 32 | 4N5Ta | 120 | 130 | 4 | 0.3 |
| Example 33 | 4N5Ta | 123 | 130 | 4.2 | 0.4 |
| Comparative Example 12 | 4N5Ta | 105 | 135 | 5.7 | 1.9 |
| Comparative Example 13 | 4N5Ta | 120 | 125 | 5.9 | 2.4 |
| Example 37 | 5NTi | 105 | 110 | 2.7 | 0.3 |
| Example 38 | 5NTi | 120 | 105 | 3.1 | 0.3 |
| Example 39 | 5NTi | 123 | 110 | 3.8 | 0.5 |
| Comparative Example 14 | 5NTi | 105 | 110 | 7.3 | 2.5 |
| Comparative Example 15 | 5NTi | 120 | 115 | 6.9 | 3 |

Comparative Examples 10 to 15

With these Comparative Examples, the target material and sputtering conditions were the same as the conditions of Examples [22] 25 to 27, 31 to 33 and 37 to 39, and the surface area and the target shape were changed. The target shape used was the target shape shown in FIG. 1. A. The results are similarly shown in Table 2.

With Comparative Examples 10 to 15, both the voltage change and uniformity increased and were inferior.

In addition, since the sputtering power was high at 40 kw, warpage of the target occurred. Thereby, it has become evident that when the sputtering power is high, problems arise in a conventional backing plate in which no consideration is given to the thickness.

Incidentally, Comparative Example 10 to Comparative Example 15 are within the scope of the present invention when viewing only the surface area. Nevertheless, since the sputtering power was raised to 40 kw, there is a problem in that the warpage will increase slightly. Therefore, although the target shape illustrated in FIG. 1. A will be sufficient when the sputtering power is low, it would be desirable to use the target shape illustrated in FIG. 1.B when sputtering is to be performed with high sputtering power.

The present invention enables the use of an inexpensive, small-capacity power supply unit and realizes low-cost, efficient sputtering by adequately enlarging the surface area of a target and minimizing the impedance change of a cathode circuit, and inhibiting changes in the current and voltage throughout the entire lifespan of the target in self ionized sputtering or high power sputtering, and enables the adequate adjustment of the uniformity of the sputtered film.

Further, under deposition conditions where the sputtering power is relatively high, heat stress will be concentrated on the concave portions and cause the target to deform, in addition to causing abnormal uniformity and generation of arcing on shields. Nevertheless, these drawbacks can be overcome by thickening the plate thickness of the backing plate (BP) of the corresponding concave portions of the target, and the sputtering target, sputtering target-backing plate assembly and deposition system of the present invention are extremely effective for industrial application.

The invention claimed is:

1. A sputtering target and backing plate assembly, comprising:
    a target having a tabular shape defined by a sputtering face exposed to sputtering, a rear face, and an annular side face, the sputtering face containing flat portions, a portion suffering erosion during sputtering, and an annular inclined face formed along a peripheral edge of the sputtering face, the rear face being parallel to the flat portions of the sputtering face, and the annular side face being perpendicular to the rear face, the target consisting of Cu, Ta, or Ti; and
    a backing plate that mates with and is secured to said rear face of said target;
    wherein said sputtering face, as prepared to be used in sputtering and before any sputtering is commenced, includes one or more annular surface irregularities each having a concave cross-sectional shape;
    said annular surface irregularities being formed by machining at a location corresponding to said portion suffering erosion during sputtering; and
    said sputtering face with said annular surface irregularities having a surface area being greater than 100% and less than 125% of the surface area of the sputtering face when flat;
    wherein the backing plate has a face having a recess in which the sputtering target is received and secured to form the sputtering target and backing plate assembly; and
    wherein said recess of the backing plate is of a first thickness at a location underlying a part of the sputtering target containing said annular surface irregularities and is of a second thickness at a location underlying a remainder of the target including a central part thereof, said first thickness being larger than said second thickness, and the rear face of the target having a shape that mates a front surface of the backing plate.

2. A sputtering target and backing plate assembly according to claim 1, wherein each of said annular surface irregularities of the sputtering face, as prepared by machining, is an annular groove having a V cross-sectional shape.

3. A sputtering target and backing plate assembly according to claim 1, wherein the surface area of the sputtering face machined with said annular surface irregularities is 105% to less than 125% of the surface area of the sputtering face when flat.

* * * * *